United States Patent [19]

Nakata et al.

[11] Patent Number: 5,047,799
[45] Date of Patent: Sep. 10, 1991

[54] IMAGE FORMING APPARATUS HAVING A PHOTOSENSITVE RECORDING MEDIUM REWINDING FUNCTION

[75] Inventors: Takashi Nakata; Tatsuya Shindo, both of Nagoya, Japan

[73] Assignee: Brother Kogyo Kabushiki Kaisha, Nagoya, Japan

[21] Appl. No.: 602,790

[22] Filed: Oct. 24, 1990

[30] Foreign Application Priority Data

Nov. 25, 1989 [JP] Japan ................................. 1-306249

[51] Int. Cl.⁵ ...................... G03B 27/32; G03B 27/52
[52] U.S. Cl. ........................................ 355/27; 355/100
[58] Field of Search .............. 355/27, 28, 10 G, 10 K, 355/10 D, 316

[56] References Cited

U.S. PATENT DOCUMENTS 4,903,070 2/1990 Nakata et al. ........................ 355/27
4,952,982 8/1990 Tabuchi ............................. 355/316

Primary Examiner—L. T. Hix
Assistant Examiner—D. Rutledge
Attorney, Agent, or Firm—Oliff & Berridge

[57] ABSTRACT

An image forming apparatus includes a cartridge spool wound with an elongated photosensitive recording sheet, a takeup spool for winding up the photosensitive recording sheet, an exposing unit for exposing the photosensitive recording sheet to light carrying image information, a cut sheet supplying unit for supplying cut sheet, a developing unit for bringing the recording sheet into contact with cut sheet so as to form an image on the cut sheet, a peeling roller for separating the photosensitive recording sheet from the cut sheet, a separation verification sensor for detecting a complete separation between the photosensitive recording sheet and the cut sheet and a rewinding motor for rotating the cartridge spool so as to rewind the cartridge spool with the photosensitive recording sheet. The rewinding motor rewinds the cartridge spool with a predetermined length of the photosensitive recording sheet, the predetermined length being equal to a distance between the exposing unit and the peeling roller, based on the detection of the separation by the separation verification sensor.

20 Claims, 4 Drawing Sheets

IMAGE FORMING APPARATUS HAVING A PHOTOSENSITVE RECORDING MEDIUM REWINDING FUNCTION

BACKGROUND OF THE INVENTION

1. Field of the Invention

The present invention relates to an image forming apparatus and, more particularly, to an image forming apparatus in which an elongated photosensitive recording medium is exposed to light which carries image information thereto to form a latent image on the photosensitive recording medium, a recording sheet is brought into contact with the photosensitive recording medium on which the latent image has been formed so that the image is formed on the recording sheet, and, thereafter, the photosensitive recording medium and the recording sheet are separated.

2. Discussion of the Related Art

A conventional image forming apparatus of this type is disclosed in U.S. Pat. No. 4,903,070. The reference discloses a color copying machine utilizing a photosensitive, pressure-sensitive process. The photosensitive, pressure-sensitive process is a technique in which a special film of photosensitive, pressure-sensitive paper, with different types of microcapsules sensitive to red light, green light or blue light being applied thereto, is exposed to the light which carries image information, and the image is transferred thereto and fixed on a color developing paper on which developer has been applied. This technique performs image development and transfer in a single process. The photosensitive, pressure-sensitive paper is generally in the form of a roll of elongated paper, and the color developing paper is generally in the form of slips of paper. The color developing paper is brought into contact with the photosensitive, pressure-sensitive paper which has passed an exposure position where exposing has been performed at a pressure development position. Thereafter, the color developing paper is moved together with the photosensitive, pressure-sensitive paper from the pressure development position to a separation position where the color developing paper is separated from the photosensitive, pressure-sensitive paper. The photosensitive, pressure-sensitive paper continues moving after it has passed the exposure position until it reaches the separation position. An unexposed portion of the photosensitive, pressure-sensitive paper is, therefore, fed in excess, and is wasted.

SUMMARY OF THE INVENTION

One manner of preventing the wasting of photosensitive, pressure-sensitive paper is to rewind the unexposed portion of the photosensitive, pressure-sensitive paper which has been fed in excess. Since the distance from the exposure position to the separation position and the length of the color developing paper are constant, the separation of the color developing paper is assumed upon detection of a feed value of the photosensitive, pressure-sensitive paper by means of an encoder provided on the feed roller which feeds the photosensitive, pressure-sensitive paper, and rewinding of the photosensitive, pressure-sensitive paper is commenced.

The timing of separation can, however, vary due to a slip between the feed roller and the photosensitive, pressure-sensitive paper or between the photosensitive, pressure-sensitive paper and the color developing paper. For this reason, an extra feed value of the photosensitive, pressure-sensitive paper needs to be set so as to ensure the separation, and the feed value to be set is the sum of the length of color developing paper, the distance from the exposure position to the separation position, and the estimated amount of slip corresponding to the extra feed value.

For the amount the photosensitive, pressure-sensitive paper is rewound, if the sum of the distance from the exposure position to the separation position and the estimated amount of slip is set, the photosensitive, pressure-sensitive paper will be rewound too much when a slip does not occur, and the image transferred portion of the photosensitive, pressure-sensitive paper can be brought back to the exposure position. Therefore, the amount of rewind is set equal to the distance from the exposure position to the separation position.

Accordingly, when no slipping has occurred at the feed of the photosensitive, pressure-sensitive paper, or in case a slip has occurred at rewinding, the photosensitive, pressure-sensitive paper will be wasted because of the feed value which includes the estimated amount of slip. The unexposed portion of the photosensitive, pressure sensitive paper cannot completely be rewound to the exposure position.

An object of the present invention is to provide an image forming apparatus which does not waste the photosensitive, pressure-sensitive paper.

A further object of the present invention is to provide a photosensitive, pressure-sensitive image forming apparatus which eliminates the need of setting a feed value inclusive of an estimated amount of slip.

To achieve the foregoing an other objects and advantages, and to overcome the shortcomings discussed above, the present invention includes an image forming apparatus in which a latent image is formed on an elongated photosensitive recording medium using light which carries image information, and thereafter the photosensitive recording medium on which the latent image has been formed is brought into contact with a recording sheet so that the image is formed on the sheet. The apparatus is provided with a detecting means which detects that the photosensitive recording medium and the recording sheet are separated after they have been in contact with each other, and a rewinding means which rewinds the photosensitive recording medium a predetermined amount in response to the detection of the separation by the detecting means.

The presence of the detecting means ensures the detection of separation of the photosensitive recording medium and the recording sheet. The confirmation of separation by the detecting means is followed by the rewinding operation of the rewinding means which rewinds the predetermined amount of photosensitive recording medium, whereby it is prevented from being wasted.

BRIEF DESCRIPTION OF THE DRAWINGS

The present invention will be described in detail with reference to the following drawings in which like reference numerals refer to like elements and wherein.

DETAILED DESCRIPTION OF THE PREFERRED EMBODIMENT

Figure 1:
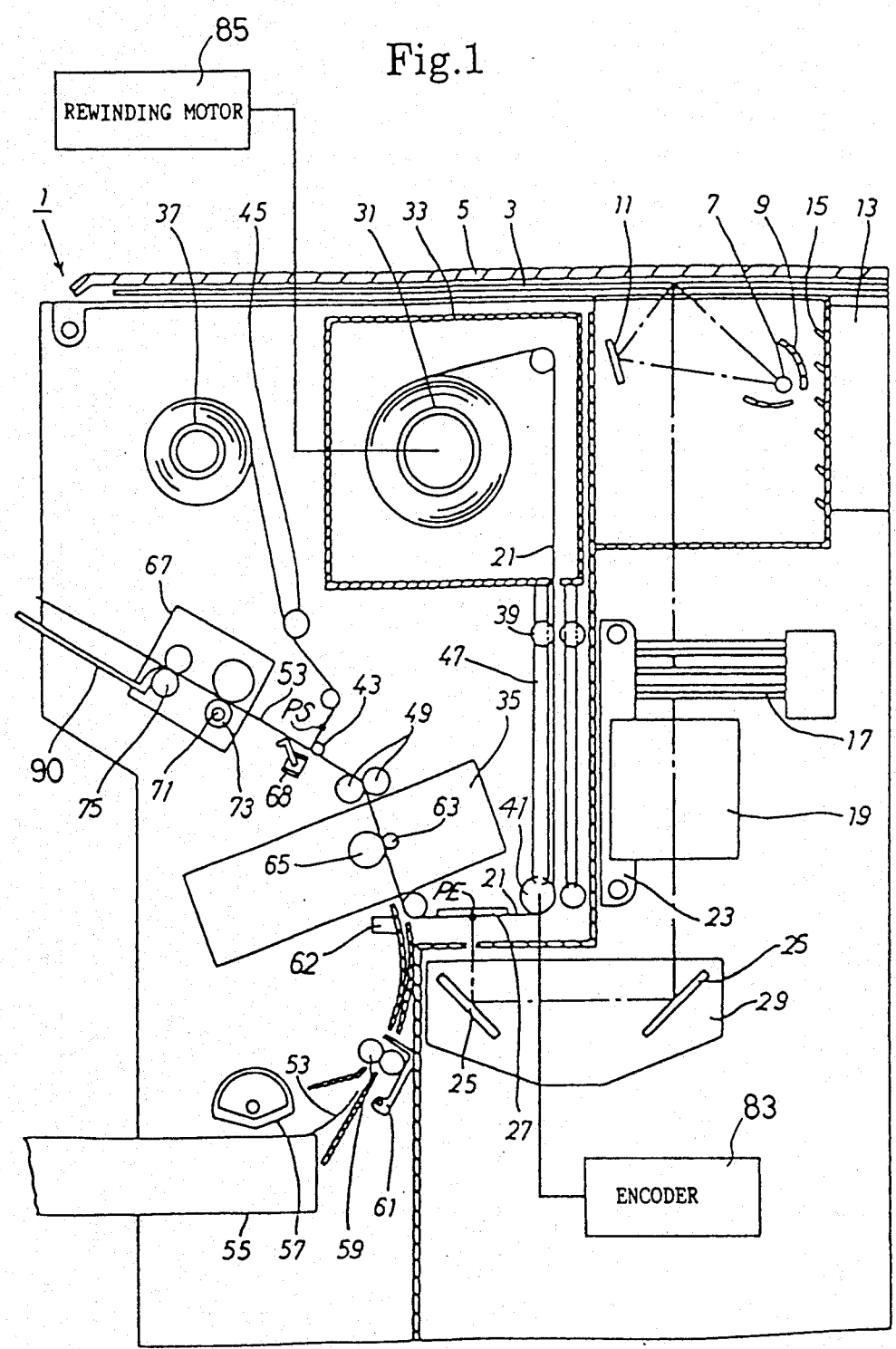
FIG. 1 is a schematic cross-sectional view of the photosensitive, pressure-sensitive copying machine according to an embodiment of the present invention.

Referring now to the drawings and particularly to FIG. 1 thereof, a photosensitive, pressure-sensitive copying machine according to the present invention is described. The photosensitive, pressure-sensitive copying machine 1 has its top section made up of a text stage glass 3 and text stage cover 5 which can be moved to the right and left, and a text (not shown) is placed face down on the text stage glass 3. Fixed at the top right section of the copying machine 1 is a light source including a halogen lamp 7 which extends in the direction orthogonal to the moving direction of the text stage glass 3 and a semi-cylindrical reflection mirror 9 which is disposed to overlie the halogen lamp 7 and which projects a line of light toward the text stage glass 3.

Accordingly, the line of light emitted by the halogen lamp 7 irradiates the whole area of the text stage glass 3 from its left end to its right end progressively through its movement in the lateral direction. The light goes through the transparent text stage glass 3 and is reflected by the text placed on it. The text stage cover 5 serves to cover the top surface of the text stage glass 3 so that the projected light does not leak from portions other than the text.

For the efficient use of the light emitted from the halogen lamp 7 for irradiating the text, there is disposed a reflector 11 on the left hand side of the light source so that the light which does not go directly to the text is reflected and used to irradiate the text. On the right-hand side of the halogen lamp 7, there are provided a fan 13 and louver 15 for introducing air from the outside. Consequently, cooling air is blown efficiently to the text stage glass 3. The light which is emitted from the halogen lamp 7 and reflected by the text located on the text stage glass 3, and now carrying image information, is introduced into a lens 19 through a filter 17. The filter 17 has its light transmission characteristics varied depending on the sensitivity of the photosensitive, pressure-sensitive paper 21 thereby to adjust the hue of the copied image. The lens 19 is mounted on a lens mount plate 23, and it can be finely adjusted for the angle with respect to the light path.

The light collected by the lens 19 is diverted 180° by a pair of reflection mirrors 25 and is focused on the photosensitive, pressure-sensitive paper 21 which is in close contact under an exposure stage 27. The pair of reflection mirrors 25 are fixed on a mirror mount plate 29, and the light path length and focus are adjusted through the fine adjustment of the position of the mirror mount plate 29.

The elongated photosensitive, pressure-sensitive paper 21 is accommodated in a detachable cartridge 33, and located below the text stage glass 3, by being wound on a cartridge spool 31. The surface of the photosensitive, pressure-sensitive paper 21 has the application of microcapsules containing a dye precursor which develops color through the reaction with a color developer, the die precurser being a light-hardening resin, etc. One end of the photosensitive, pressure-sensitive paper 21 is led to a takeup spool 37 by way of several rollers and a pressure developing unit 35.

The photosensitive, pressure-sensitive paper 21 fed out of the bottom of the cartridge 33 is led by a feed roller 39 and a drum roller 41 and is supplied to the pressure developing unit 35 by being fed below the exposure stage 27. After the passage through the pressure developing unit 35, the photosensitive, pressure-sensitive paper 21 is led by a peeling roller 43 and a guide roller 45 and is wound on the takeup spool 37. The unexposed portion of the photosensitive, pressure-sensitive paper 21, immediately after being fed out of the cartridqe 33, is kept unexposed by means of a blind cover 47.

The photosensitive, pressure-sensitive paper 21 has its feed speed controlled constant by a photosensitive, pressure-sensitive paper feed roller 49, and made equal to the moving speed of the text stage glass 3 so that latent images of certain lines of the text are formed sequentially on the photosensitive, pressure-sensitive paper 21 as it passes through the exposure stage 27.

Under the pressure development unit 35, there is provided a cassette 55 of color developing paper which accommodates cut sheets of color developing paper 53. The surface of the color developing paper 53 has the application of color developer. The color developing paper 53 is taken out of the color developing paper cassette 55 by a sector roller 57, one sheet at a time, and, after the leading edge adjustment has been performed by a color developing paper roller 59 and a resist gate 61, the color developing paper 53 is fed together with the photosensitive, pressure-sensitive paper 21 to the paper entry port of the pressure development unit 35. Accordingly, the pressure development unit 35 is supplied with the photosensitive, pressure-sensitive paper 21 and the color developing paper 53 in close contact with each other. The presence of color developing paper 53 is detected by a color developing paper sensor 62 immediately before it contacts the photosensitive, pressure-sensitive paper 21 in overlying relationship.

The pressure development unit 35 is made up of a small-diameter roller 63 and a backup roller 65. The photosensitive, pressure-sensitive paper 21 and the color developing paper 53, with their microcapsule application surface on which a latent image has been formed and the color developer application surface, respectively, being in face-to-face contact with each other, are pressed between the small-diameter roller 63 and the backup roller 65. Unexposed (i.e., unhardened) microcapsules are broken by the pressure, and the dye precursor contained in the microcapsules is transferred to the color developing paper 53. The dye precursor reacts with the color developer to produce colors, and a color image is formed on the color developing paper 53. The small-diameter roller 63 and the backup roller 65 are in the open state when the color developing paper sensor 62 is not detecting the presence of the color developing paper 53. Both rollers 63 and 65 are brought into pressure contact by a drive mechanism (not shown) upon detection of the presence of color developing paper 53, and the pressure development operation begins. Similarly, the photosensitive, pressure-sensitive paper feed roller 49 is also operated in response to the output of the color developing paper sensor 62.

Figure 2A:
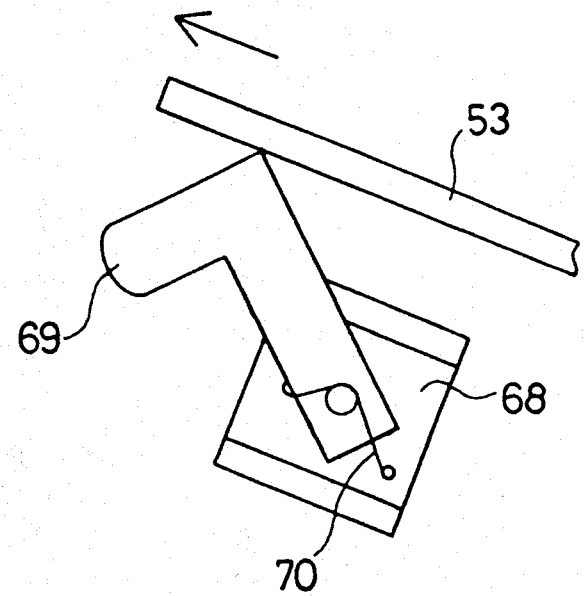
FIGS. 2(a) and 2(b) are a set of front views of the separation verification sensor, with FIG. 2(a) showing the ON-state of the separation verification sensor, and FIG. 2(b) showing the OFF-state of the separation verification sensor.
Figure 2B:
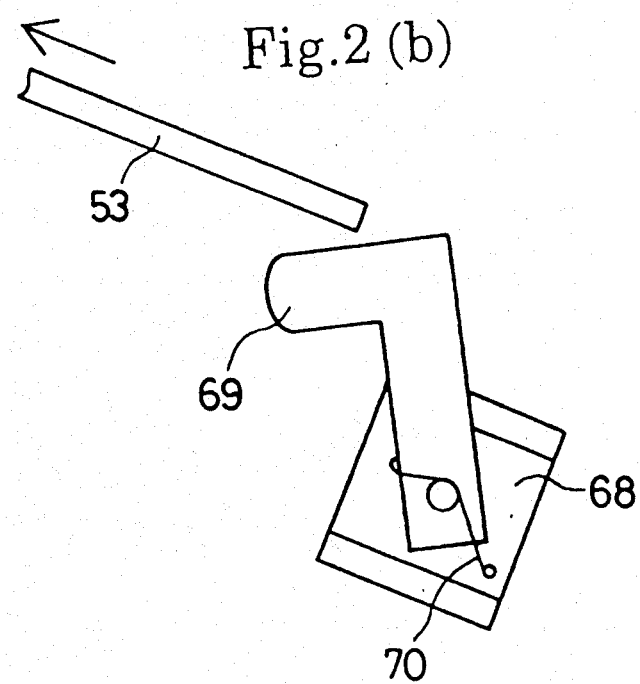

The photosensitive, pressure-sensitive paper 21 and the color developing paper 53 exiting the pressure development unit 35 are fed by the photosensitive, pressure-sensitive paper feed roller 49 and are separated by the peeling roller 43. The photosensitive, pressure-sensitive paper 21 and the color developing paper 53 then move in different directions with the photosensitive, pressure sensitive paper 21 moving upward and the color developing paper 53 moving downward. Provided in the vicinity of the peeling roller 43 at the position between the peeling roller 43 and a thermal fixing unit 67 is a separation verification sensor 68. An L-shaped arm 69 is pivoted on the separation verification sensor 68 as shown in FIGS. 2(a) and 2(b). The arm 69 is biased to the clockwise direction by a spring 70. As shown in FIG. 2(a), the color developing paper 53 separated by the peeling roller 43 comes into contact with the arm 69 of the separation verification sensor 68, causing the arm 69 to turn in the counterclockwise direction against the force of the spring 70. In response to the counterclockwise turn of the arm 69, the separation verification sensor 68 produces an ON signal. As shown in FIG. 2(b), when the color developing paper 53 comes off the peeling roller 43, it releases the arm 69 of the separation verification sensor 68, causing the arm 69 to swing in the clockwise direction by the force of the spring 70. In consequence, the separation verification sensor 68 produces an OFF signal. The separation of the color developing paper 53 from the peeling roller 43 indicates the separation between the color developing paper 53 and the photosensitive, pressure-sensitive paper 21. Accordingly, when the output of the separation verification sensor 68 changes from ON to OFF, it means that the color developing paper 53 and the photosensitive, pressure-sensitive paper 21, which have previously been in contact with each other, are now separated.

The separated color developing paper 53 is advanced for color development by the thermal fixing unit 67, and after the formation of image, it is delivered, with its image surface facing upward, to a delivery tray 90. The thermal fixing unit 67 is made up of a hollow heating roller 73 having a heater 71 therein, and a color developing paper feed roller 75.

Next, the operation of the photosensitive, pressure-sensitive copying machine will be explained. With the text stage cover 5 being opened, a text is placed on the text stage glass 3, and then the text stage cover 5 is closed. When a start button on a control panel (not shown) is pressed, the text stage glass 3 moves to the right in FIG. 1, and it stops at such a position that the left end of the text stage glass 3 confronts the light source. Subsequently, when the halogen lamp 7 is turned on, the text stage glass 3 is moved to the left. The light emitted from the halogen lamp 7 is reflected by the text, conducted through the filter 17 and the lens 19, reflected by the pair of reflection mirrors 25, and focused on the photosensitive, pressure-sensitive paper 21 which is located under the exposure stage 27. At this time, the photosensitive, pressure-sensitive paper 21 is being fed on the exposure stage 27 at the same speed and direction as the text stage glass 3, and a latent image of the text is formed on the photosensitive, pressure-sensitive paper 21. Assuming the text to be a monochromatic printed matter, the latent image is formed in black.

Through the leftward movement of the text stage glass 3, a piece of color developing paper 53 is taken out of the color developing paper cassette 55 by means of the sector roller 57, and it is supplied to the pressure development unit 35 by being overlaid on the exposed photosensitive, pressure-sensitive paper 21. The latent image on the photosensitive, pressure-sensitive paper 21 is color-activated and is transferred onto the color developing paper 53.

After the text stage glass 3 has reached such a position that its right end confronts the light source, copying of text completes, and the halogen lamp 7 is turned off. The color developing paper 53 is subjected to the thermal fixing process by the thermal fixing unit 67, and thereafter the paper 53, with a copy of the text image being formed on it, is delivered to the outside of the copying machine 1.

Figure 3:
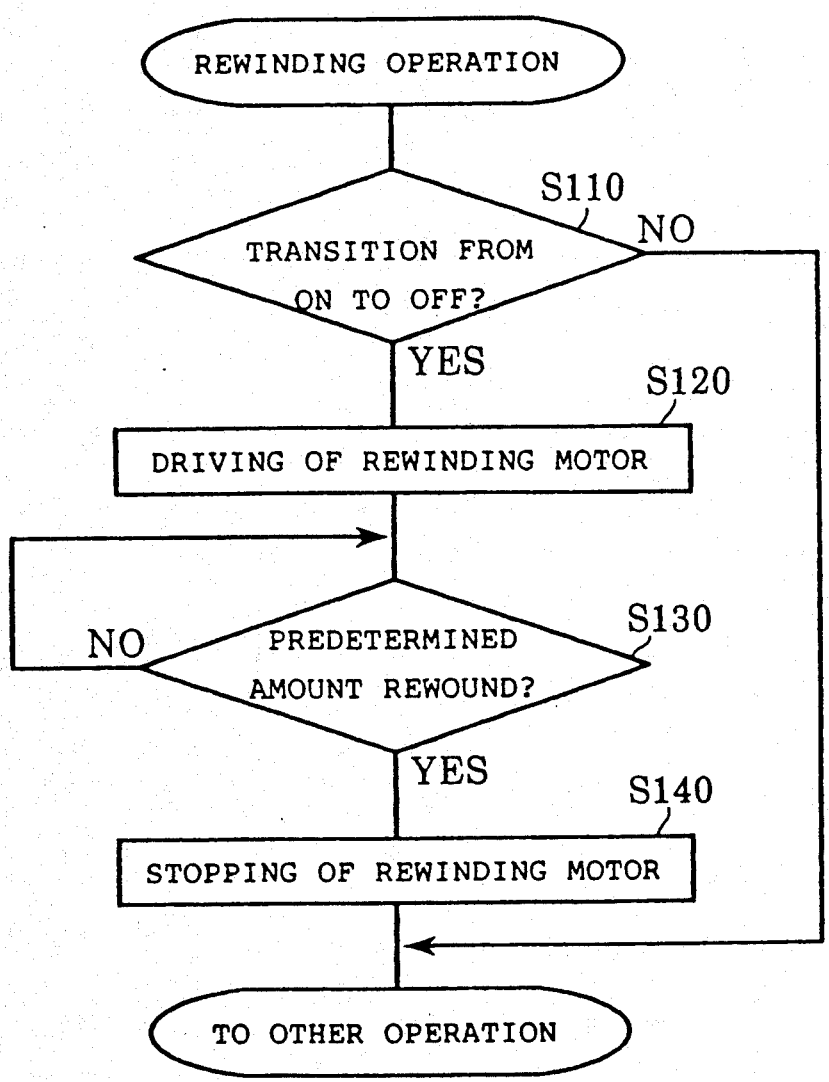
FIG. 3 is a flowchart showing the paper rewinding operation.

The photosensitive, pressure-sensitive paper 21 is wound on the takeup spool 37 until the color developing paper 53 is separated. Immediately after the separation of the end of color developing paper 53 from the photosensitive, pressure-sensitive paper 21, the rewinding operation shown by the flowchart of FIG. 3 is carried out by a control system shown in FIG. 4.

Figure 4:
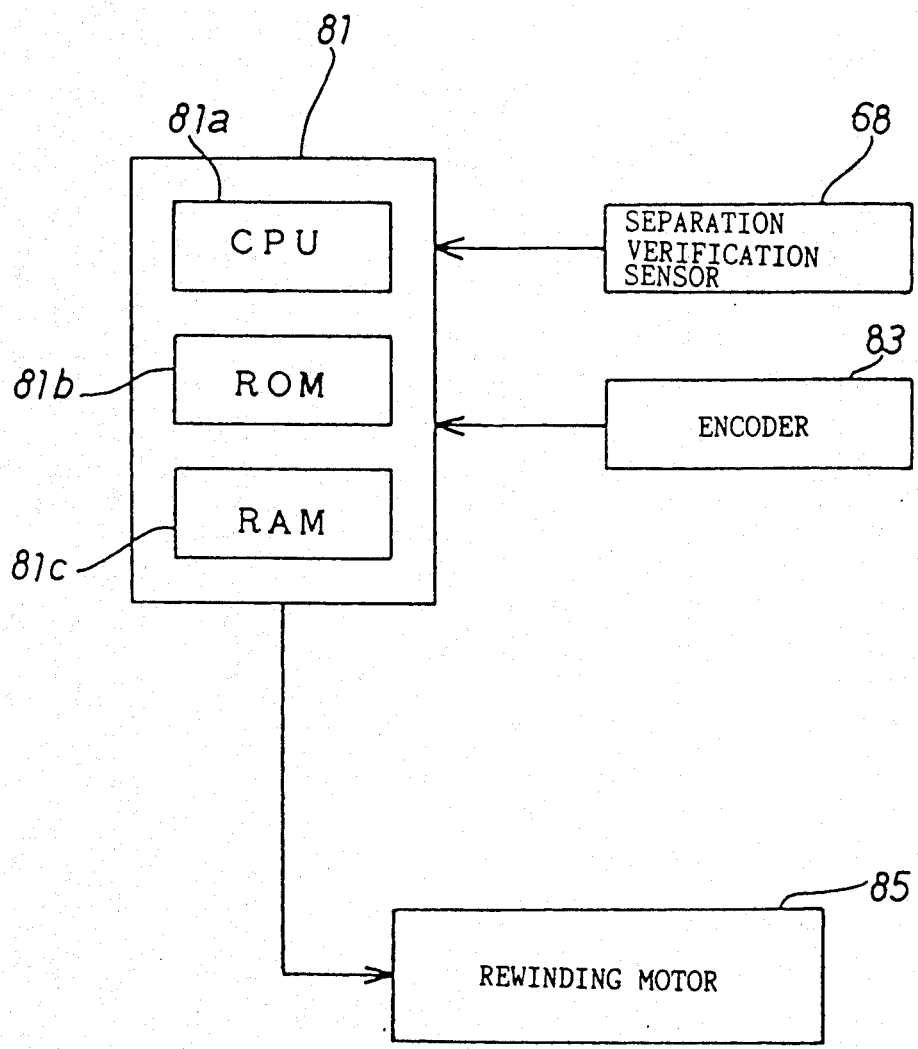
FIG. 4 is a block diagram showing the control system which performs the paper rewinding operation.

The control system includes a computer controller 81 including a CPU 81a, ROM 81b, RAM 81c, etc., and is adapted to control the entirety of the photosensitive, pressure-sensitive copying machine 1. The portion shown in FIG. 4 is that which is pertinent to the rewinding operation. An encoder 83 detects the amount of rotation of the drum roller 41 and outputs pulses corresponding to the amount of rotation of the drum roller 41. A rewinding motor 85 rotates the cartridge spool 31 in the rewinding direction during the rewinding operation. An amount of rewinding unexposed, photosensitive, pressure-sensitive paper 21 is predetermined to be equal to a length of the feeding path of the paper 21 from an exposing position PE beneath the exposure stage 27 to a separating position PS downstream of the peeling roller 43. The separating position PS is experimentally determined to be a position where a trailing edge of the exposed portion of the paper 21 is located in the feeding path of the paper 21 at the time of transition of the separation verification sensor 68 from ON to OFF. The number of output pulses to be generated by the encoder 83 is predetermined based on the predetermined amount of rewinding and is stored in the ROM 81b.

The rewinding operation commences at the time of a passage of a trailing edge of the color developing paper 53 as shown in FIG. 2(b), i.e., in response to the transition of the output signal of the separation verification sensor 68 from ON to OFF, indicative of the complete separation of the color developing paper 53 from the photosensitive, pressure-sensitive paper 21, at which time the rewinding motor 85 is activated (step 110, 120). The small diameter roller 63 and the backup roller 65 are in an open state since the color developing paper sensor 62 is not detecting the presence of the color developing paper 53. The rewinding motor 85 is kept active until the predetermined amount of paper 21 is rewound as detected through the count of the output pulses of the encoder 83 (step 130). When the count of the output pulses of the encoder 83 reaches the predetermined number in ROM 81b corresponding to the predetermined amount of rewinding, the rewinding motor 85 is deactivated (step 140), and the control operation proceeds to the next step.

When the copy start button is pressed again, the foregoing operation is repeated to make another copy of the text and rewind the unexposed portion of the paper.

According to this embodiment, as described above, the rewinding operation is based on the accurate detection of separation of the color developing paper 53 from the photosensitive, pressure-sensitive paper 21 by means of the separation verification sensor 68, which eliminates the need of setting a feed value inclusive of an estimated slip, thereby preventing wasting of the photosensitive, pressure-sensitive paper 21.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image forming apparatus which forms a latent image on an elongated photosensitive recording medium using light which carries image information, and forms the image on a recording sheet by bringing the recording sheet in contact with the photosensitive recording medium on which the latent image has been formed, said apparatus comprising:
   a detecting means for detecting a separation between the photosensitive recording medium and the recording sheet; and
   a rewinding means for rewinding the photosensitive recording medium a predetermined amount in response to the detection of the separation by said detecting means.

2. The image forming apparatus as recited in claim 1, wherein said rewinding means rewinds the photosensitive recording medium an amount equal to a length of a feeding path of the photosensitive recording medium from an exposing position where the latent image is formed to a separating position where the photosensitive recording medium is separated from the recording sheet.

3. The image forming apparatus as recited in claim wherein said detecting means is disposed at a position where the photosensitive recording medium and the recording sheet are separated from each other.

4. The image forming apparatus as recited in claim 1, wherein said detecting means detects a passage of the recording sheet at a predetermined position.

5. The image forming apparatus as recited in claim 4, wherein said detecting means detects a passage of a trailing edge of the recording sheet at said predetermined position.

6. The image forming apparatus as recited in claim 1, wherein said detecting means includes a pivotable contact arm and a spring for biasing the contact arm in a predetermined direction.

7. The image forming apparatus as recited in claim 6, wherein said contact arm is disposed along a feeding path of the recording sheet and said spring biases said contact arm to come into contact with the recording sheet.

8. The image forming apparatus as recited in claim 1, wherein said rewinding means includes a memory means for storing said predetermined amount of rewinding the photosensitive recording medium, means for measuring a rewound length of the photosensitive recording medium, and means for controlling a rewinding operation according to comparison of the rewound length measured by said measuring means with said predetermined amount stored in said memory means.

9. An image forming apparatus comprising:
   a supply spool wound with an elongated photosensitive recording sheet;
   a takeup spool for winding up the photosensitive recording sheet supplied from said supply spool;
   feeding means for feeding the photosensitive recording sheet from said supply spool to said takeup spool;
   exposing means provided between said supply spool and said takeup spool in a feeding path of the photosensitive recording sheet, said exposing means exposing the photosensitive recording sheet to light carrying image information, whereby a latent image is formed on the photosensitive recording sheet;
   cut sheet supply means for supplying cut sheet;
   developing means provided at a downstream side of said exposing means in the feeding path of the photosensitive recording sheet, said developing means bringing the photosensitive recording sheet into contact with cut sheet supplied from said cut sheet supply means, so as to form an image corresponding to the latent image formed on the photosensitive recording sheet on the cut sheet;
   separating means provided at a downstream side of said developing means in the feeding path of the photosensitive recording sheet, said separating means separating the photosensitive recording sheet from the cut sheet;
   detecting means provided at a position adjacent to said separating means, said detecting means detecting a complete separation between the photosensitive recording sheet and the cut sheet; and
   rewinding means for rewinding said supply spool with a predetermined length of the photosensitive recording sheet in response to the detection of the complete separation by said detecting means.

10. The image forming apparatus as recited in claim 9, wherein said rewinding means rewinds the supply spool with a predetermined length of the photosensitive recording sheet equal to a distance between an exposing position of said exposing means and a separating position of said separating means in the feeding path of the photosensitive recording sheet.

11. The image forming apparatus as recited in claim 9, wherein said detecting means detects a passage of the cut sheet at a predetermined position.

12. The image forming apparatus as recited in claim 11, wherein said detecting means detects a passage of a trailing edge of the cut sheet at said predetermined position.

13. The image forming apparatus as recited in claim 9, wherein said detecting means includes a pivotable contact arm and a spring for biasing the contact arm in a predetermined direction.

14. The image forming apparatus as recited in claim 13, wherein said contact arm is disposed along a feeding path of the cut sheet and said spring biases said contact arm to come into contact with the cut sheet.

15. The image forming apparatus as recited in claim 9, wherein said rewinding means includes a memory means for storing said predetermined amount of rewinding the photosensitive recording sheet, means for measuring a rewound length of the photosensitive recording sheet, and means for controlling a rewinding operation according to comparison of the rewound length measured by said measuring means with said predetermined amount stored in said memory means.

16. An image forming apparatus which forms a latent image on an elongated photosensitive recording medium using light which carries image information and forms the image on a recording sheet by bringing the recording sheet in contact with the photosensitive recording medium on which the latent image has been formed, said apparatus comprising:
- exposing means for exposing the photosensitive recording medium to the light carrying image information;
- separating means which separates the recording sheet from the photosensitive recording medium following image formation on the recording sheet;
- detecting means provided at a position adjacent to said separating means, said detecting means detecting a complete separation between the recording sheet and the photosensitive recording medium; and
- rewinding means for rewinding the photosensitive recording medium a predetermined amount in response to the detection of separation by said detecting means.

17. The image forming apparatus as recited in claim 16, wherein said rewinding means rewinds the photosensitive recording medium a predetermined amount equal to a distance between an exposing position of said exposing means and a separating position of said separating means.

18. The image forming apparatus as recited in claim 16, wherein said detecting means detects a passage of the recording sheet at a predetermined position.

19. The image forming apparatus as recited in claim 18, wherein said detecting means detects a passage of a trailing edge of the recording sheet at said predetermined position.

20. The image forming apparatus as recited in claim 16, wherein said rewinding means includes a memory means for storing said predetermined amount of rewinding the photosensitive recording medium, means for measuring a rewound length of the photosensitive recording medium, and means for controlling a rewinding operation according to comparison of the rewound length measured by said measuring means with said predetermined amount stored in said memory means.

* * * * *